(12) United States Patent
Fujioka et al.

(10) Patent No.: US 6,492,872 B1
(45) Date of Patent: Dec. 10, 2002

(54) HIGH FREQUENCY POWER AMPLIFYING MODULE AND WIRELESS COMMUNICATION APPARATUS

(75) Inventors: Toru Fujioka, Kokubunji (JP); Yoshikuni Matsunaga, Hachioji (JP); Isao Yoshida, Hinode (JP); Masatoshi Morikawa, Hanno (JP); Masao Hotta, Hanno (JP); Tetsuaki Adachi, Tobu (JP)

(73) Assignees: Hitachi, Ltd., Tokyo (JP); Hitachi Tohbu Semiconductor, Ltd., Gunma (JP)

( * ) Notice: Subject to any disclaimer, the term of this patent is extended or adjusted under 35 U.S.C. 154(b) by 70 days.

(21) Appl. No.: 09/657,237

(22) Filed: Sep. 7, 2000

(30) Foreign Application Priority Data

Sep. 29, 1999 (JP) .............................. 11-275465

(51) Int. Cl.[7] .............................. H03G 3/10; H03G 9/00
(52) U.S. Cl. ........................ 330/285; 330/133; 330/134
(58) Field of Search ................................ 330/133, 134, 330/285

(56) References Cited

U.S. PATENT DOCUMENTS

| 5,220,290 | A | * | 6/1993 | Black |
| 5,455,968 | A | * | 10/1995 | Pham |
| 6,101,373 | A | * | 8/2000 | Samuels |
| 6,172,567 | B1 | * | 1/2001 | Ueno et al. |
| 6,188,283 | B1 | * | 2/2001 | Hagio et al. |
| 6,271,727 | B1 | * | 8/2001 | Schmukler |

FOREIGN PATENT DOCUMENTS

JP  7-94975  4/1995

* cited by examiner

Primary Examiner—Patricia Nguyen
(74) Attorney, Agent, or Firm—Mattingly, Stanger & Malur, P.C.

(57) ABSTRACT

A high frequency power amplifier module is provided for improving output controllability. A wireless communication apparatus incorporates a high frequency power amplifier module in a multi-stage configuration including a plurality of cascaded MOSFETS. The power amplifier module comprises a bias circuit for generating a gate voltage in response to a power control voltage (vapc) generated based on a power control signal of the wireless communication apparatus. The gate voltage has a bias pattern which presents smaller fluctuations in output power in response to a control voltage (Vapc) in a region near a threshold voltage (Vth) of the MOSFETs in respective amplification stages. In this way, the controllability for the output power is improved. More specifically, the power amplifier module has a gate bias circuit for generating the gate voltage (Vg) which follows a gate voltage pattern. The gate voltage (Vg) supplied to a control terminal in response to the control voltage (Vapc) largely changes in a region where the gate voltage (Vg) is lower than the threshold voltage (Vth) of the respective MOSFETs, and slightly changes near the threshold voltage (Vth). Also, the gate voltage (Vg) presents desired characteristics from the vicinity of the threshold voltage (Vth) to a high Vapc voltage region.

8 Claims, 12 Drawing Sheets

HIGH FREQUENCY POWER AMPLIFYING MODULE AND WIRELESS COMMUNICATION APPARATUS

CROSS-REFERENCE TO RELATED APPLICATIONS

This application relates to an application U.S. Ser. No. 09/385,690 filed on Aug. 30, 1999 by a joint inventor et al. and assigned to the present assignees. The disclosure of that application is incorporated by reference herein.

BACKGROUND OF THE INVENTION

The present invention relates generally to a high frequency power amplifier module in a multi-stage configuration having a plurality of cascaded semiconductor amplifiers (variable power amplifier) and a wireless communication apparatus incorporating this high frequency power amplifier module, and particularly, to the technology which is effectively applied to improve the controllability for the output power by a control voltage.

More specifically, the present invention relates to a high frequency power amplifier module of a type which changes the transconductance by a gate bias for changing the output power of the high frequency amplifier module without a significant increase in power consumption, wherein the high frequency power amplifier module comprises a gate bias control circuit for controlling the gate bias, i.e., a drain current, for use in improving the control lability for the output power by a control voltage.

Mobile communication devices, for example, wireless communication apparatus for use in automobile telephones, portable telephones and so on typically have a built-in high frequency power amplifier module, i.e., a high frequency power amplifier circuit in a transmission output stage thereof. The high frequency power amplifier module is configured to automatically control the output (transmission power) by an APC (Automatic Power Control) circuit.

For example, a high frequency power amplifier module having a plurality of cascaded MOSFETs (Metal Oxide Semiconductor Field-Effect-Transistor) as semiconductor amplifier devices has been widely employed up to now because of its convenience in handling, resulting from the fact that the output can be readily controlled by a positive voltage (for n-channel MOSFETs) biased to the gate.

JP-A-7-94975 discloses a three-stage high frequency HIC (Hybrid IC) module, i.e., a high frequency power amplifier module, which has MOSFETs cascaded in the first, middle and last stages.

This high frequency HIC (hybrid IC) module comprises a first bias circuit configured to bias a gate of a predetermined MOSFET out of MOSFETs in a plurality of stages, based on an output control voltage; a second bias circuit for biasing gates of the remaining MOSFETs other than the predetermined MOSFET based on a fixed power supply; and a switching means for switching a path associated with the fixed power supply and a path associated with the second bias circuit in accordance with the output control voltage. This configuration is intended to improve the controllability of the output and the efficiency.

Each of the bias circuits is composed of three resistors and a capacitor.

The above-cited literature, however, does not describe any technique for controlling the gate bias, which changes in response to a control voltage vapc, in accordance with the output power.

Generally, a setting for the gate bias which changes in response to the control voltage Vapc is determined by the value of a resistor forming part of the bias circuit, for example, in such a manner that the efficiency is improved as the output power is larger.

SUMMARY OF THE INVENTION

The conventional high frequency HIC module changes the transconductance by applying appropriate voltages to the gates of the MOSFETs in the respective stages. This module is advantageous in that a variable output power can be provided in a small circuit configuration without adversely affecting the output power or efficiency.

However, since the gate bias changes at a constant rate in response the control voltage, the bias in each stage for the control voltage cannot be controlled on account of the fluctuating output power of the high frequency power amplifier module, resulting in poor controllability for the output power and inconvenience in utilization. Stated another way, although this high frequency HIC module produces the bias which merely results in good characteristics as a module, it cannot prevent the output power from abruptly changing in response to the control voltage Vapc.

The above cited literature discloses a diagram showing the correlation of the output control voltage Vapc to the output Po. FIG. 16 is a graph which shows the characteristic of an output power Pout versus a control voltage Vapc, similar to the above. This graph was derived from a test conducted by the present inventors.

As can be seen in the characteristic graph, the output power exhibits abrupt rising for a portion of the control voltage, for example, in a range of 1.1 to 1.5 volts, from which it can be understood that there is a problem in controlling the output for practical use.

This abruptly rising region is present when a gate voltage applied to a MOSFET for amplification which lastly operates (turns on) is close to a threshold voltage Vth. This is because, in this region of the gate voltage, the gain of the MOSFET largely varies, and simultaneously the impedance also largely varies, so that a matching loss of a matching circuit largely varies as well.

Further, as the transconductance $g_r$ is improved due to improved performances of recent devices, MOSFETs used in respective stages present larger gain fluctuations with gate bias, resulting in a tendency to more abrupt output power fluctuations and lower output controllability.

It should be noted that the foregoing problem of poor controllability for the output is not limited to the MOSFET but is common to other semiconductor amplifier devices which have a variable gain in response to a control bias applied to a control terminal.

It is an object of the present invention to provide a high frequency power amplifier module which has good output controllability.

It is another object of the present invention to provide a wireless communication apparatus which comprises the high frequency power amplifier module having the good output controllability.

The above and other objects and novel characteristics of the present invention will become apparent from the description in the specification and the accompanying drawings.

Within various embodiments of the invention disclosed in this application, typical aspects will be described below in brief.

A high frequency power amplifier module (power module) using MOSFETs as semiconductor amplifier devices in accordance with one aspect of the present invention comprises a bias circuit for generating a gate voltage in response to a control voltage Vapc generated based on a power control signal of a wireless communication apparatus to reduce fluctuations in output power in response to the control voltage Vpac in a region near a threshold voltage Vth of MOSFETS in respective amplification stages. This provides a power module which facilitates handling in consideration of the controllability for the output power.

Specifically, the power module controls the output power Pout outputted from an output terminal by controlling a gate voltage which is generated in accordance with a division of the control voltage vapc supplied to a bias supply terminal. The gate bias circuit has a circuit for setting the gate voltage supplied to a control terminal, which is responsive to the control voltage Vapc, so as to change largely in a region where the gate voltage Vg is lower than the threshold voltage Vth of the respective MOSFETs; to change slightly near the threshold voltage Vth; and to present desired power amplification characteristics from the vicinity of the threshold voltage Vth to a high Vapc voltage region.

When the gate bias circuit is applied to a multi-stage power module, the control voltage Vapc serves as an optimal gate bias for each MOSFET through the gate bias circuit. The timing at which the MOSFET in each stage turns on in response to the control voltage Vapc is also set in accordance with fluctuations in the gate bias of each stage with respect to the control voltage Vapc.

Next, a bias circuit for a multi-stage power module will be described particularly in terms of the timing at which the MOSFET in each stage turns on, with reference to FIG. 12 which shows changes in the gate voltages Vg of the MOSFETs in the respective stages in response to the control voltage Vapc.

FIG. 12 is a graph which shows how a first-stage gate voltage Vg1, a middle-stage gate voltage Vg2 and a last-stage gate voltage Vg3 change in response to the control voltage Vapc when the bias circuit is applied to a three-stage power module which has three MOSFETs cascaded in sequence. In the power module having the bias circuit exhibiting the gate voltage characteristics as represented by this graph, the first-stage MOSFET (Q1), which has a slight increase in gate voltage Vg1, is designed to turn from off to on lastly as the control voltage Vapc increases. In this event, the control voltage Vapc is set in a region in which the gate voltage vg1 of the first-stage MOSFET, which lastly turns on, fluctuates slightly, while the remaining MOSFETs are set to a gate bias which results in small fluctuations in gain in response to the control voltage vapc. In addition, by turning the remaining MOSFETs on to operate stably prior to the first-stage MOSFET which lastly turns on, the output power of the power module gradually increases from an off-state.

In the power module comprising the bias circuit having the foregoing operation characteristics, the gate voltage Vg largely changes in response to the control voltage Vapc in a region lower than the threshold voltage Vth, and the output power of the power module can be controlled from a low Vapc voltage region, so that a variable range for the output power in response to the control voltage Vapc can be made wide from lower power to high power.

In a region near the threshold voltage Vth, the gate voltage Vg is set to change slightly, thus making it possible to reduce fluctuations in the output power in response to the control voltage Vapc.

In a voltage region higher than the vicinity of the threshold voltage Vth, the bias can be set based on desired high frequency characteristics, so that the improved controllability for the output power will never cause a degraded performance of the power module.

With the ability of setting the timing at which the MOSFET in each stage turns on, prior to the first-stage MOSFET which lastly turns on, the remaining MOSFETs are first turned on to gradually increase the output power from an off-state of the module as illustrated in FIG. 12, so that the controllability is improved in a very low output power region.

Further, the remaining MOSFETs are set in an operation range in which the gain slightly fluctuates when the first-stage MOSFET (Q1) turns on, and fluctuations in the output power are mainly adjusted by a gate voltage Vg1 of the first-stage MOSFET which lastly turns on, so that an abrupt rising of the output power can be mitigated.

As described above, according to the present invention, since fluctuations in the gate voltage Vg is reduced in a region near the threshold voltage Vth where the gain and impedance largely vary in response to the gate voltage Vg, it is possible to limit abrupt rising of the output power and therefore improve the controllability. Also, since the configuration of the present invention can set a gate voltage to simultaneously realize a high output and a high efficiency, the characteristics of the power module will not be degraded. Further, since the output is controlled by controlling the gate voltage, such a control expedient will not result in a reduction in the output power and the efficiency of the power module. In this way, the present invention provides for a good controllability for the output power and convenient handling while maintaining high output power and high efficiency of the power module.

Other objects, features and advantages of the present invention will become apparent from the following description of the embodiments of the invention taken in conjunction with the accompanying drawings.

DETAILED DESCRIPTION OF THE EMBODIMENTS

Figure 1A:
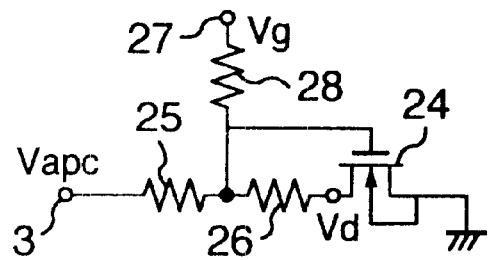
FIG. 1A is a circuit diagram illustrating a bias circuit in a high frequency power amplifier module according to one embodiment (first embodiment) of the present invention.

Embodiments of the present invention will hereinafter be described in detail with reference to the accompanying drawings. It should be first noted that in all drawings for describing embodiments of the present invention, components having the same functions are designated the same reference numerals, and repeated description thereon will be omitted.

(First Embodiment)

FIGS. 1 to 4 are diagrams related to a high frequency power amplifier module according to a first embodiment of the present invention, and a wireless communication apparatus which incorporates the high frequency power amplifier module.

Figure 2:
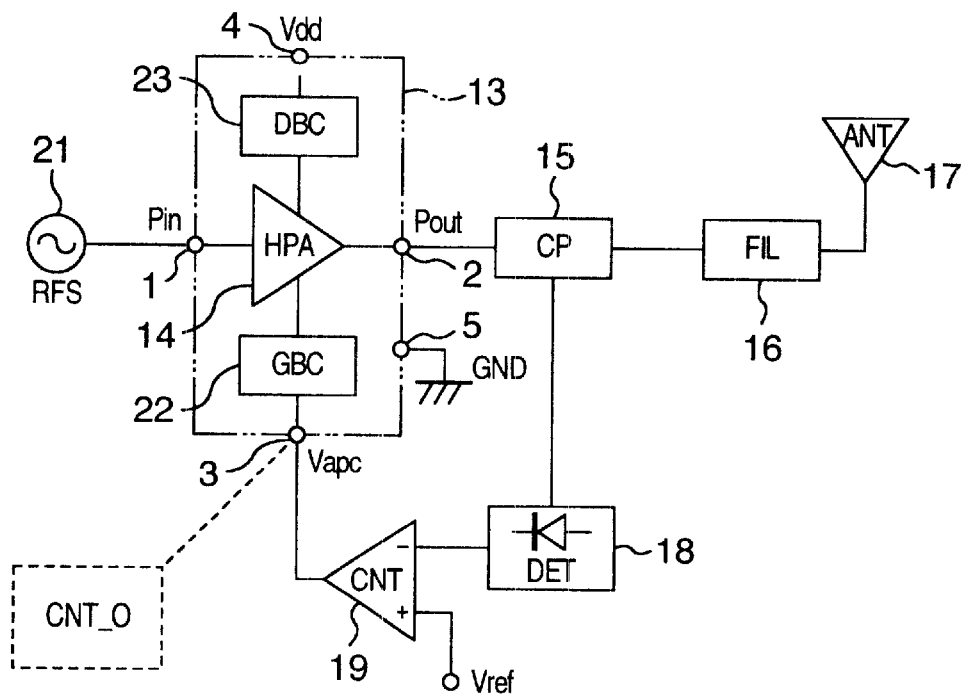
FIG. 2 is a block diagram illustrating the configuration of a portion of a wireless communication apparatus incorporating the high frequency power amplifier module according to the first embodiment.

FIG. 2 illustrates the functional configuration of a portion of a wireless communication apparatus in block diagram form. As illustrated in FIG. 2, a high frequency power amplifier module (power module) 13 has, as external terminals, an input terminal 1, an output terminal 2, a control terminal (bias supply terminal) 3, a first voltage terminal 4, and a second voltage terminal 5. A high frequency power amplifier (HPA) 14 forming part of the high frequency amplifier module 13 receives input power Pin from the input terminal 1, and delivers its output power Pout to the output terminal 2.

A control voltage Vapc supplied to the control terminal 3 is supplied to the high frequency power amplifier 14 through a gate bias circuit (GBC) 22 for controlling the output power Pout. A power supply voltage Vdd at the first voltage terminal 4 is supplied to the high frequency power amplifier 14 through a drain bias circuit (DBC) 23. The gate bias circuit 22 and the drain bias circuit 23 are composed of resistors and transistors. For semiconductor amplifier devices constituting the high frequency power amplifier 14, MOSFETs made of silicon semiconductor are employed, and the control terminal 3 is connected to the gate of each MOSFET through the gate bias circuit 22.

The power module 13 is supplied at the input terminal 1 with a high frequency signal from a high delivered from the output terminal 2 of the power module 13 passes through a filter (FIL) 16 and is irradiated from an antenna (ANT) 17 to the air as radio waves.

The output power Pout delivered from the output signal detected by the coupler 15 is sent to a transmission power control circuit 19 through a detector 18. The transmission power control circuit 19 compares the output signal with a reference voltage Vref to apply a control voltage Vapc to the control terminal (bias supply terminal) 3 by the action of APC (Automatic Power Control).

In the configuration as described above, the signal (Pout) delivered from the output terminal 2 of the high frequency power amplifier 14 is transmitted from the antenna 17 through the coupler 15 and the filter 16. Also, the output signal detected by the coupler 15 is sent to the transmission power control circuit 19 through the detector 18 and compared with the reference voltage Vref, and the resulting control voltage Vapc is applied to the control terminal 3 by the action of the APC.

In the first embodiment, the output power is controlled by biasing the gate through the gate bias control voltage Vapc.

Specifically, as the control voltage Vapc is applied to the control terminal 3, the control voltage Vapc is divided by resistors and a transistor constituting the gate bias circuit 22 in accordance with the output control voltage, and then applied to the gate of the MOSFET forming part of the high frequency power amplifier 14. This gate voltage can be adjusted by the resistors and transistor constituting the gate bias circuit 22, so that the high frequency power amplifier 14 is designed to reduce fluctuations in response to the control voltage Vapc near a threshold voltage Vth of the MOSFET, where the output power largely fluctuates in response to the control voltage vapc.

By thus setting the gate voltage appropriately with respect to the control voltage vapc, it is possible to avoid applying a gate bias which causes a sudden increase in the output power with an increase in the output control voltage Vapc, as has been experienced in the past, so that the controllability is improved.

Specifically, in the power amplifier module according to the first embodiment, since the gate voltage can be adjusted with respect to the control voltage Vapc by the gate bias circuit 22 in accordance with the output power, this can eliminate the need for controlling the output power in a narrow output control voltage range.

The foregoing effect is not limited to the configuration utilizing a feedback circuit as described above but can be similarly provided in a configuration in which a control voltage is sent from an external control circuit CNT_0.

In the following, description will be centered on the gate bias circuit for adjusting the gate voltage in accordance with the control voltage Vapc to divide the gate voltage.

Figure 1B:
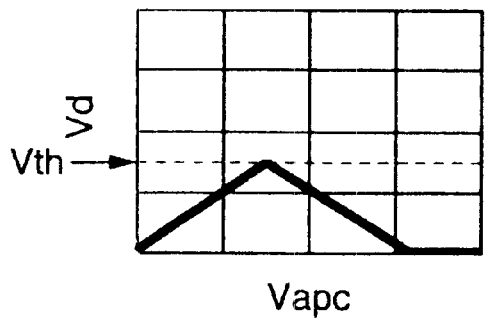
FIGS. 1B and 1C are graphs showing the characteristics of the bias circuit of FIG. 1A.
Figure 1C:
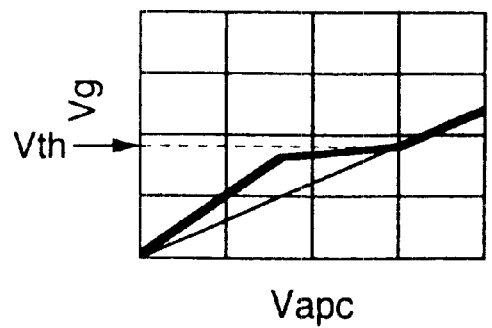
Figure 3:
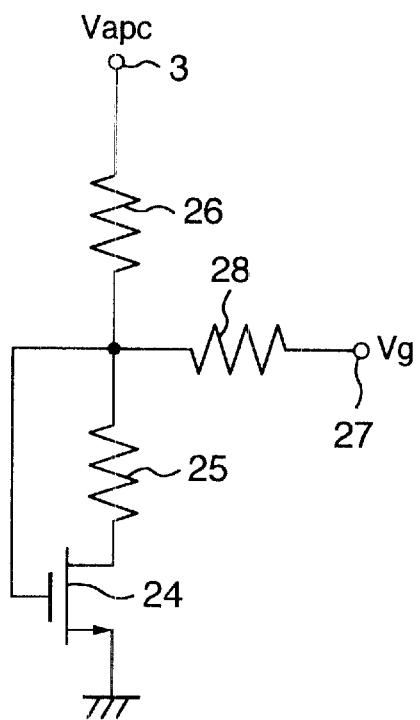
FIG. 3 is a circuit diagram illustrating a bias circuit in the high frequency amplifier module according to the first embodiment.

FIG. 3 illustrates the bias circuit in the first embodiment, and FIG. 1A and FIGS. 1B, 1C show the same bias circuit and its characteristics, respectively. The graphs show the correlation of a drain voltage Vd to the control voltage Vapc (FIG. 1B), and the correlation of a gate voltage Vg to the control voltage Vapc (FIG. 1C).

The gate bias circuit according to the first embodiment is a bias circuit which exhibits two-step change nonlinear characteristics. The bias circuit comprises a first resistor 25 having one terminal connected to a control terminal 3; a second resistor 26 connected to the the terminal of the first resistor 25; a transistor 24 diode-connected to the second resistor 26 and having the remaining terminal grounded; and a resistor 28 connected between the joint of the first resistor 25 and the second resistor 26 and a control terminal 27 of a semiconductor amplifier device for cutting high frequency signal components.

A threshold voltage Vth of the transistor 24 is set to the same threshold voltage Vth of the semiconductor amplifier devices used in the high frequency power amplifier 14 or to a low value close to this. The threshold voltage Vth thus set is advantageous in that the MOSFET used in the gate bias circuit can be implemented with a small gate width Wg.

The gate bias circuit according to the first embodiment employs an N-channel MOSFET 24 for nonlinearly adjusting a change in the gate voltage Vg in response to the control voltage Vapc with a positive differential coefficient. The MOSFET 24 has a grounded source, a drain terminal connected to one terminal of the first resister 25, the other terminal of which is connected to a gate of the MOSFET 24, to the other terminal of the second resistor 26 having one terminal connected to the control terminal 3, and to the other terminal of the resistor 28 having one terminal connected to the gate bias applying terminal 27 of the MOSFET for amplification.

In the foregoing circuit configuration, the first resistor 25 and the second resistor 26 are used to divide the control voltage Vapc, while the resistor 28 is provided for cutting high frequency signal components, and used to prevent the high frequency signal components from leaking from the MOSFET for amplification through the MOSFET 24 to degrade the high frequency characteristic. The control terminal 3 is supplied with a positive voltage from an external control circuit. The respective resistors may be implemented by chips or printed resistors manufactured by the semiconductor manufacturing technology. The printed resistors provide for integration with the MOSFET 24 in a single chip, application of the same semiconductor process technologies as the MOSFET for amplification, and implementation of MMIC (Microwave Monolithic IC).

Next, the operation of the bias circuit according to the first embodiment will be described.

Here, a drain-source resistance of the MOSFET 24 is controlled by the gate voltage of the MOSFET 24, and varies from an approximately off-state near the threshold voltage Vth to an on-state as the gate voltage increases in response to an increase in the control voltage Vapc.

FIG. 1A illustrates an example of the bias circuit according to the first embodiment, and FIGS. 1B, 1C generally show the characteristics of a voltage Vd at the drain terminal of the MOSFET 24 versus the control voltage Vapc, and the characteristics of a voltage at the gate bias applying terminal (gate voltage) Vg versus the control voltage Vapc, respectively.

As shown in FIG. 1B, as the control voltage Vapc increases, the voltage Vd at the drain terminal of the MOSFET 24 increases because of the MOSFET 24 remaining in off-state until the gate voltage of the MOSFET 24 reaches near the threshold voltage Vth, and subsequently begins falling and again reaches approximately zero potential. For this reason, as shown in FIG. 1C, the voltage Vg at the gate bias applying terminal is set such that the same voltage as the control voltage Vapc is outputted up to the vicinity of the threshold voltage Vth, a voltage presenting a slight change is outputted near the threshold voltage Vth, making use of the reduced voltage Vd at the drain terminal, in a region around the threshold voltage Vth, and a voltage mainly determined by a division ratio of the resistors 25, 26 is outputted because of the MOSFET 24 in on-state in a higher region of the voltage Vg at the gate bias applying terminal.

As described above, the change in the voltage Vg at the gate bias applying terminal in response to the control voltage Vapc differs depending on the value of the control voltage Vapc, and the operation region is generally divided into three subregions depending on a changing amount of the control voltage vapc. The respective regions provide a two-step change nonlinear control, wherein the voltage Vg at the gate bias applying terminal abruptly changes in response to the control voltage Vapc until the vicinity of the threshold voltage Vth of the MOSFET 24, presents a slight change in a region near the threshold voltage Vth, and changes upward in a higher region of the control voltage Vapc. A changing amount of the voltage Vg at the gate bias applying terminal can be set with respect to the control voltage Vapc in each of the regions by adjusting parameters of the MOSFET 24 such as a gate width Wg, a gate length Lg, the threshold voltage Vth and so on, as well as the resistors 25, 26.

Figure 4A:
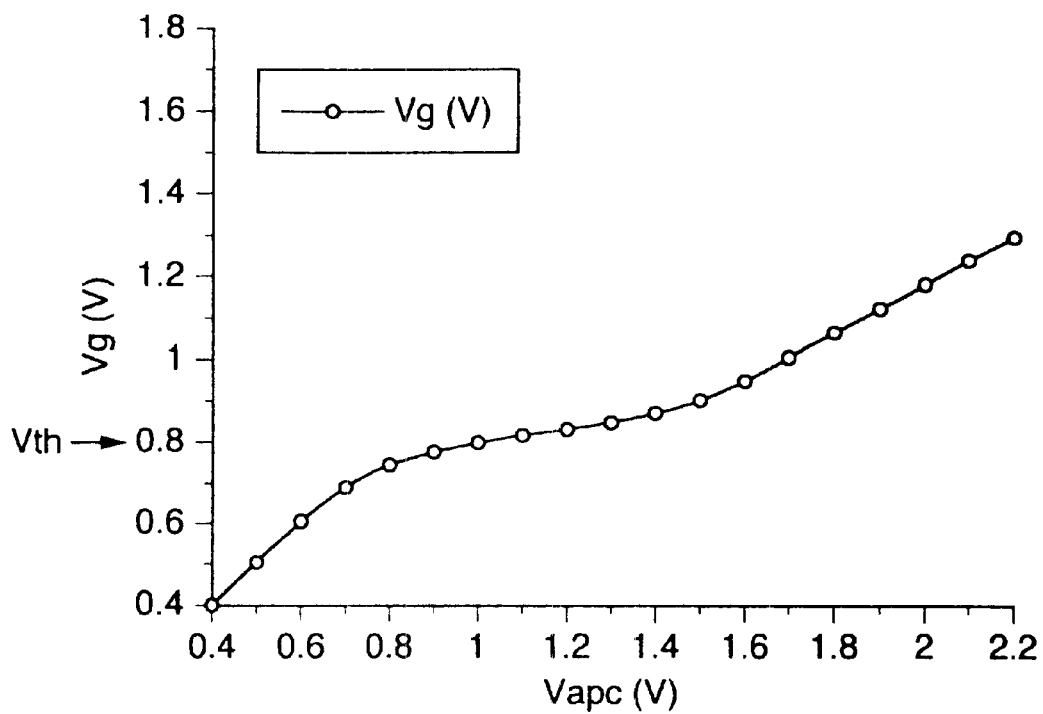
FIG. 4A is a graph showing the characteristic of a specific bias circuit in the high frequency power amplifier module according to the first embodiment.
Figure 4B:
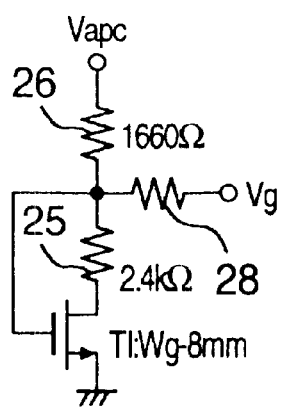
FIG. 4B is a circuit diagram showing exemplary parameters for the bias circuit.

For example, assuming that the bias voltage must be set at 1.2 volts for achieving a desired performance with the efficiency balanced with the output power as the RF characteristic of a power module, to which the bias circuit of this embodiment is applied, when the threshold voltage Vth of a MOSFET for amplification used in the power module is 0.8 volts, a gate bias circuit exhibiting the characteristic as shown in FIG. 4A must be provided for improving the controllability in terms of the control voltage Vapc without damaging the desired performance. FIG. 4A is a characteristic graph showing the gate voltage Vg versus the control voltage Vapc. As shown in FIG. 4A, the voltage Vg at the gate bias applying terminal is set at 1.2 volts within a controllable range of the control voltage Vapc to reduce fluctuations in the voltage vg at the gate bias applying terminal near the threshold voltage vth at 0.8 volts to prevent an abrupt change in the output power to achieve the desired characteristic. Here, since the threshold voltage Vth of the employed MOSFET 24 can be set at 0.8 volts which is the same as that of the MOSFET for amplification, the same semiconductor process technologies can be employed for manufacturing the bias circuit. It is therefore possible to integrate the components of the bias circuit including the resistors 25, 26, 28 in a single chip to help improve the yield, increase the number of available chips, and reduce the manufacturing cost. FIG. 4B shows the parameters of the respective circuit components associated with the foregoing design.

When heterobipolar transistors (HBT) utilizing a junction of different materials such as GaAs and AlGaAs are employed in place of the MOSFETs as the semiconductor amplifying devices, the HBT can also be used for the bias circuit as well, in which case the resistors can be implemented by similar elements to those for use with the MOSFETS.

As described above, since the bias circuit according to the first embodiment controls the change in the gate voltage in response to the control voltage in accordance with fluctuations in the output power, an abrupt change in the output power is mitigated to improve the controllability of the output power.

Also, since an optimal bias can be set to provide a desired performance such as a high output and a high efficiency, the characteristics of the power module will not be degraded.

Thus, a wireless communication apparatus such as a portable phone incorporating the high frequency power amplifier module according to the first embodiment exhibits good controllability for the output power, so that it can accurately respond to transmission power information instructed by a base station to make a call with the most desirable output. This can accomplish a longer lifetime of a battery contained therein.

It should be noted that when the diode-connected transistor is replaced with a diode, similar effects to those of the foregoing embodiment can be produced as well.

(Second Embodiment)

Figure 5:
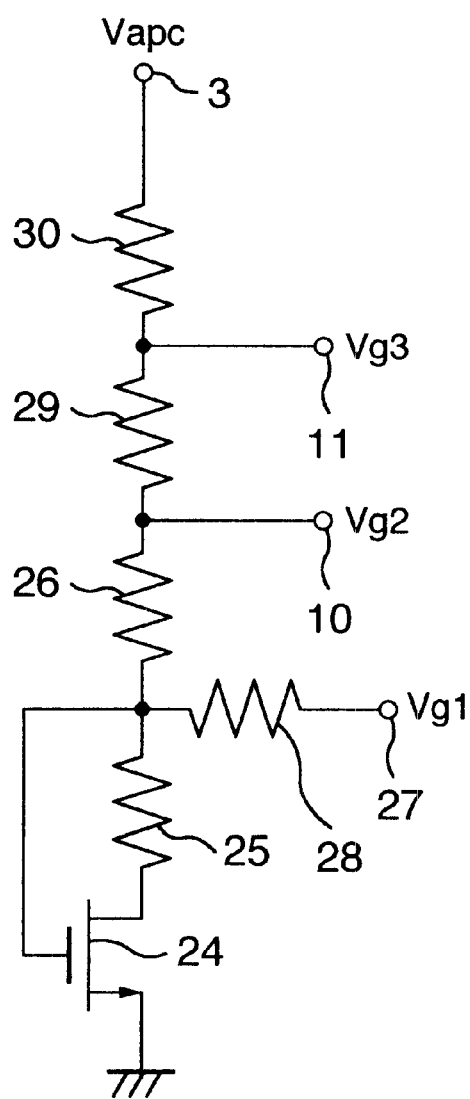
FIG. 5 is a circuit diagram illustrating a bias circuit incorporated in a three-stage high frequency power amplifier module according to another embodiment (second embodiment) of the present invention.

FIG. 5 illustrates a portion of a high frequency power amplifier module according to another embodiment of the present invention. The second embodiment shows an example of a three-stage high frequency power amplifier module, having the first, middle and last stages, to which the bias circuit of the first embodiment is incorporated.

The bias circuit in the high frequency power amplifier module according to the second embodiment additionally includes a number of resistors having an appropriate resistance in accordance with the number of stages, which is connected in series with one end of the second resistor 26 connected to the control terminal 3 in the bias circuit of the first embodiment, such that a gate bias applying terminal can be added to each joint. For example, as illustrated in FIG. 5, when the bias circuit is applied to a three-stage power module, resistors 29, 30 are connected in series with the control terminal of the second resistor 26 to provide each bias from each joint. The respective joints are connected to control terminals 10, 11 of MOSFETs in the middle stage and in the last stage, respectively.

When the bias circuit according to the first embodiment is applied to a multi-stage high frequency power amplifier module, similar effects to those of the foregoing embodiment can be produced.

(Third Embodiment)

Figure 6:
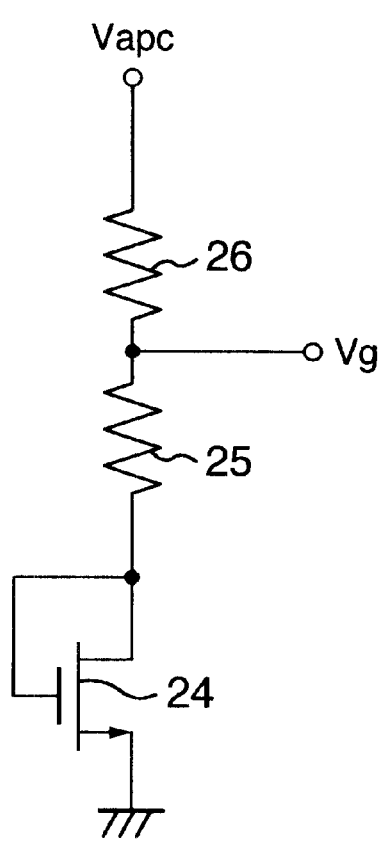
FIG. 6 is a circuit diagram illustrating a bias circuit in a high frequency power amplifier module according to a further embodiment (third embodiment) of the present invention.

FIGS. 6 and 7 are diagrams related to a bias circuit in a high frequency power amplifier module according to a further embodiment of the present invention. While the foregoing first and second embodiments nonlinearly controls the gate bias to exhibit different changes in two steps, the method of controlling the gate bias is not limited to the nonlinear control which provides two-step changes. The third embodiment describes a bias circuit which exhibits nonlinear characteristics with a single-step change.

The bias circuit of the third embodiment differs from the bias circuit of the first embodiment in that the gate of the MOSFET 24 is connected directly to the drain thereof, and the RF cutting high-impedance resistor 28 is omitted (see FIG. 6).

Figure 7A:
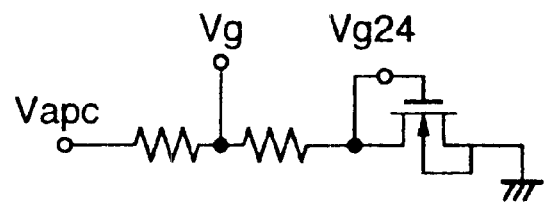
FIG. 7A is a circuit diagram illustrating a bias circuit according to the third embodiment.
Figure 7B:
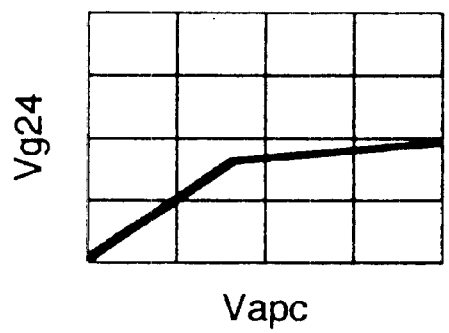
FIGS. 7B and 7C are graphs showing the characteristics of the bias circuit of FIG. 7A.
Figure 7C:
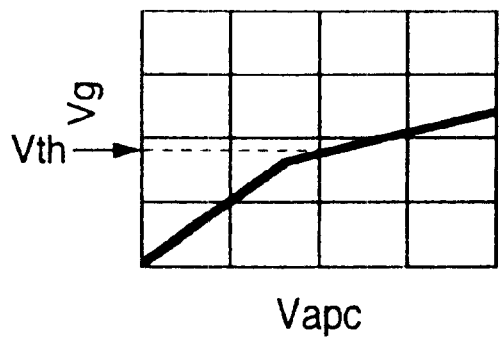

FIGS. 7A to 7C generally show a circuit diagram equivalent to the bias circuit of FIG. 6; a characteristic graph of a voltage Vg24 at the gate terminal of the MOSFET 24 versus the control voltage Vapc; and a characteristic graph of a voltage at a gate bias applying terminal, i.e., a gate voltage Vg versus a control voltage vapc.

As the control voltage Vapc increases, the voltage Vg24 at the gate terminal of the MOSFET 24 increases because of the MOSFET 24 remaining in off-state until the vicinity of the threshold voltage Vth, and then is substantially saturated. For this reason, as shown in FIG. 7C, the voltage Vg at the gate bias applying terminal set is such that the same voltage as the control voltage Vapc is outputted up to the vicinity of the threshold voltage Vth, a voltage presenting a slight change near the threshold voltage Vth is outputted in a region around the threshold voltage vth, and a voltage mainly determined by a division ratio of the resistors 25, 26 is outputted because of the MOSFET 24 in on-state in a higher region of the voltage Vg at the gate bias applying terminal.

As described above, the change in the voltage Vg at the gate bias applying terminal in response to the control voltage Vapc differs depending on the value of the control voltage Vapc, and the operation region is generally divided into two subregions depending on a changing amount of the control voltage Vapc. The respective regions provide a single-step change nonlinear control, wherein the voltage Vg at the gate bias applying terminal abruptly changes in response to the control voltage Vapc until the vicinity of the threshold voltage vth of the MOSFET 24, and presents a slight change in a region near the threshold voltage Vth. The voltage Vg at the gate bias applying terminal can be set with respect to the control voltage Vapc in each of the regions by adjusting parameters of the MOSFET 24 such as a gate width, a gate length, the threshold voltage Vth and so on, as well as the resistors 25, 26.

Since the foregoing configuration can also control the output power widely from lower to high power with the control voltage Vapc, an abrupt change in the output power can be mitigated to improve the controllability.

In the foregoing configuration, the bias circuit of the third embodiment does not require the resistor 28 for cutting high frequency signal components in FIG. 1, and can be integrated in a single chip together with other components as well as implemented in a multi-stage configuration, as is the case of the aforementioned bias circuits in the previous embodiments. Also, the bias circuit of the third embodiment may employ a device having the diode characteristics such as a diode in place of the diode-connected MOSFET 24. Further, the bias circuit of the third embodiment may employ a heterobipolar transistor (HBT) utilizing a junction of different materials such as GaAs and AlGaAs, as is the case of the foregoing embodiments of the two-step change bias circuits.

(Fourth Embodiment)

Figure 8:
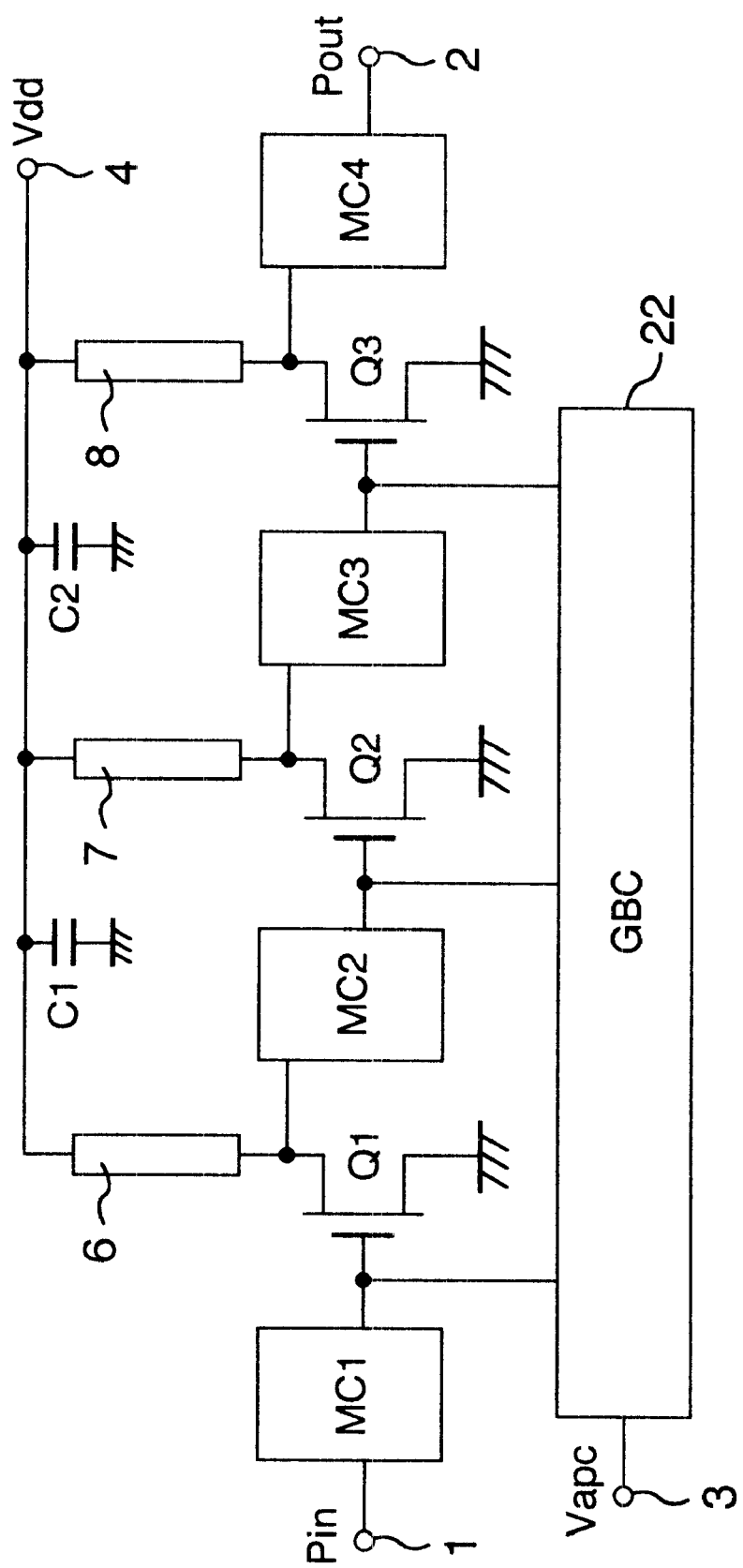
FIG. 8 is a block diagram illustrating a three-stage high frequency power amplifier module according to a further embodiment (fourth embodiment) of the present invention.
Figure 9:
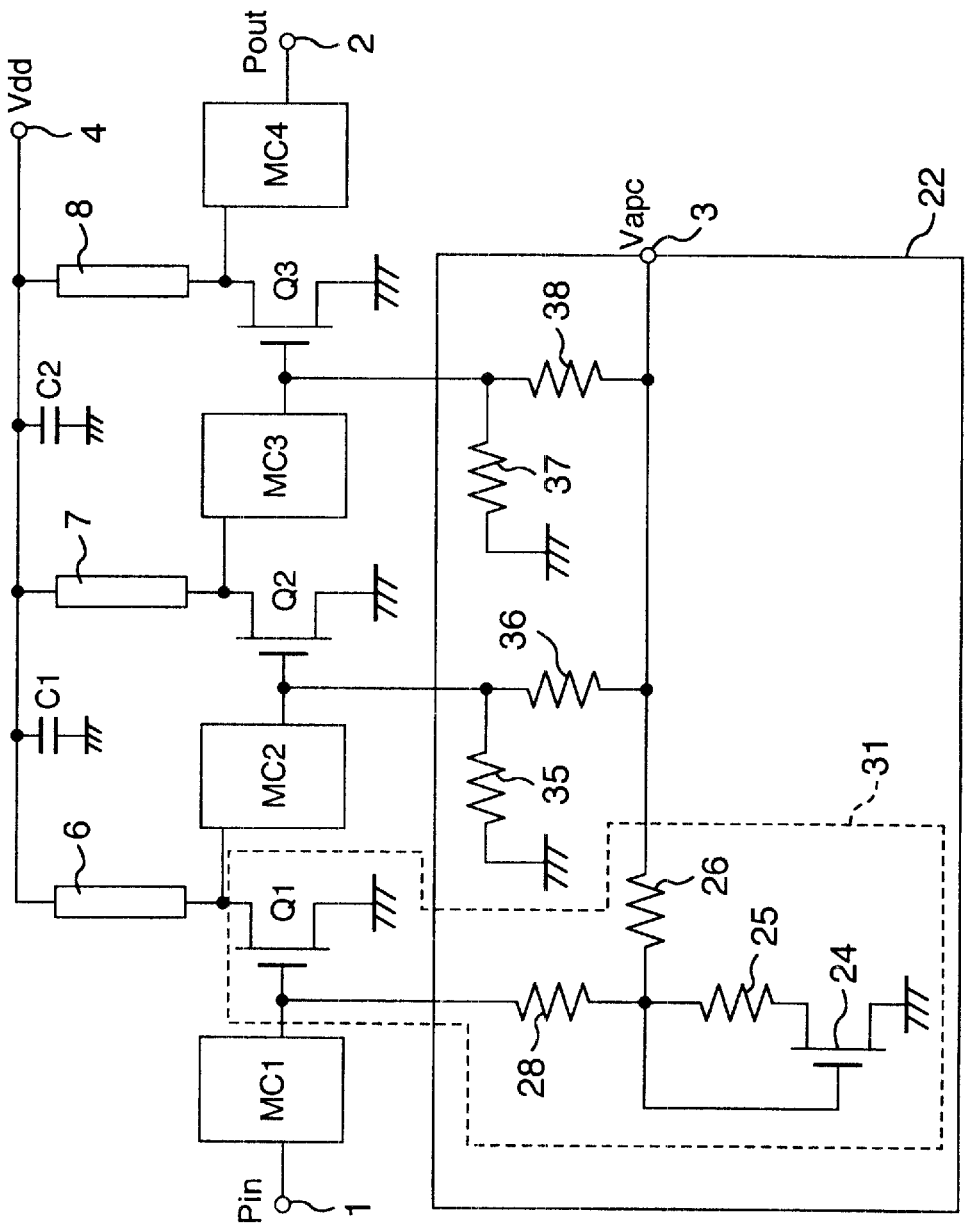
FIG. 9 is a circuit diagram illustrating in detail the high frequency power amplifier module according to the fourth embodiment of the present invention.
Figure 10:
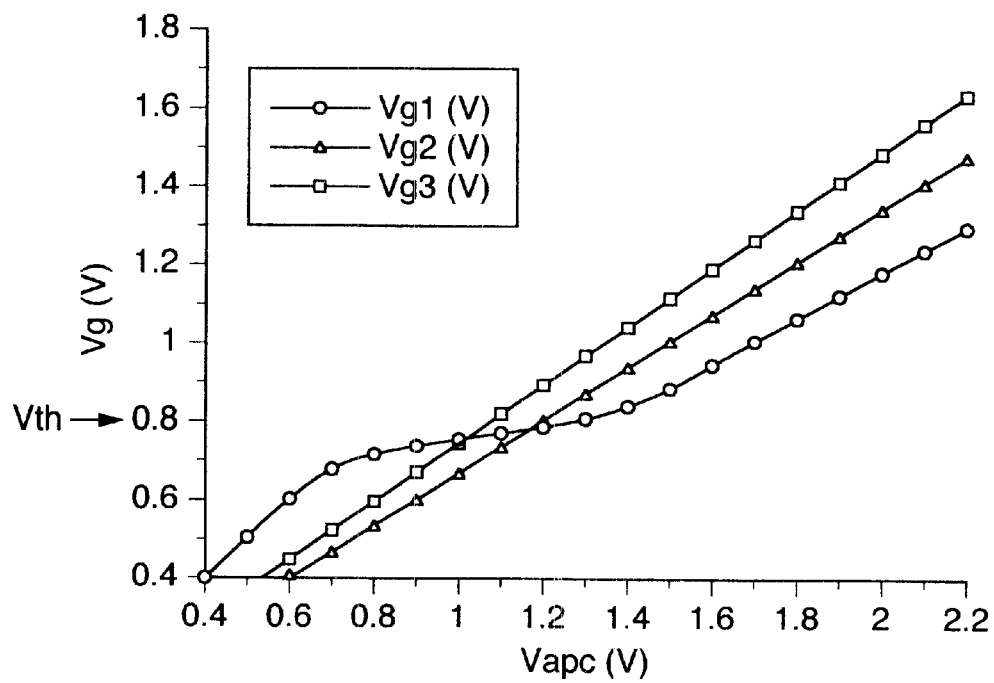
FIG. 10 is a graph showing the correlation of gate voltages to a control voltage associated with a bias circuit in the high frequency power amplifier module according to the fourth embodiment.

FIGS. 8 to 10 are diagrams related to a high frequency power amplifier module in a three-stage amplifier configuration according to a further embodiment of the present invention. The fourth embodiment will be described for an example in which the present invention is applied to a high frequency power amplifier module in a three-stage amplifier configuration which has a first-stage semiconductor amplifier device, a middle-stage semiconductor amplifier device, and a last-stage semiconductor amplifier device.

FIG. 8 illustrates the circuit of the three-stage amplification power module according to the fourth embodiment in block diagram form. This power module has three semiconductor amplifying devices (transistors) Q1, Q2, Q3, between an input terminal 1 and an output terminal 2, which are cascaded through matching circuits MC1, MC2, MC3, MC4, respectively. The transistors may be N-channel MOSFETs. The respective transistors Q1, Q2, Q3 have their drain terminals connected to a first voltage terminal 4 (power supply voltage Vdd) through micro-strip lines 6, 7, 8, respectively. A capacitor C1 is arranged between the micro-strip lines 6, 7 between the transistors Q1, Q2, while a capacitor C2 is arranged between the micro-strip lines 7, 8 between the transistors Q2, Q3. Also, control terminals of the respective transistors Q1, Q2, Q3 are connected through a gate bias circuit (GBC) 22 to a control terminal 3 which is supplied with a control voltage Vapc from an external control circuit.

In the foregoing configuration, since biases to the transistors Q1, Q2, Q3 are generally set to turn on these transistors in the order of the last stage, the middle stage and the first stage, the output power largely fluctuates when the first stage turns on.

Thus, in an embodiment for applying the gate bias circuit to the power module, a two-step change or a single-step change nonlinear bias in the aforementioned embodiments is employed for the first-stage MOSFET. By employing the two-step change or single-step change nonlinear bias for the first-stage MOSFET, fluctuations in the gate voltage can be reduced near the threshold voltage Vt, where the output power exhibits large fluctuations, to limit an abrupt change in the output power. Particularly, with the two-step change nonlinear bias, the middle stage and the last stage are in a gate voltage region where the output power fluctuates less, when the first-stage MOSFET turns on, so that a larger effect can be produced. Since the threshold voltage Vth of the MOSFET in the bias circuit is identical or close to the threshold voltage Vth of the MOSFETs for amplification, they can be formed by the same semiconductor process technologies, thereby making it possible to reduce variations in the characteristics of the devices and to integrate them into a single chip.

FIG. 9 illustrates an example in which the two-step change nonlinear bias is applied. In FIG. 9, an MOSFET Q1 24, resistors 25, 26, 28 may be integrated in a single chip 31 to limit variations in the characteristics of the devices.

Resistors 35–38 forming a divider circuit are arranged between control terminals of transistors Q2, Q3 and a control terminal 3.

The high frequency power amplifier module according to the fourth embodiment exhibits the characteristics as shown in FIG. 10. FIG. 10 is a graph showing changes in gate voltages Vg of the transistors Q1, Q2, Q3 in response to the control voltage Vapc, where the threshold voltage Vth of the transistors Q1, Q2, Q3 is set, for example, to 0.8 volts.

While the transistors Q2, Q3 exhibit linear characteristics, the transistor Q1 exhibits nonlinear characteristics and changes in two steps. Since the gate voltage Vg has a smaller changing rate at the threshold voltage Vth and in a region below the threshold voltage Vth, the high frequency power amplifier module exhibits a good controllability for the gate voltage Vg, i.e., a good controllability for the output power Pout. In addition, since the first-stage transistor Q1 operates lastly, and the other transistors Q2, Q3 are operating stably when the transistor Q1 begins operating, a stable amplification can be carried out.

(Fifth Embodiment)

Figure 12:
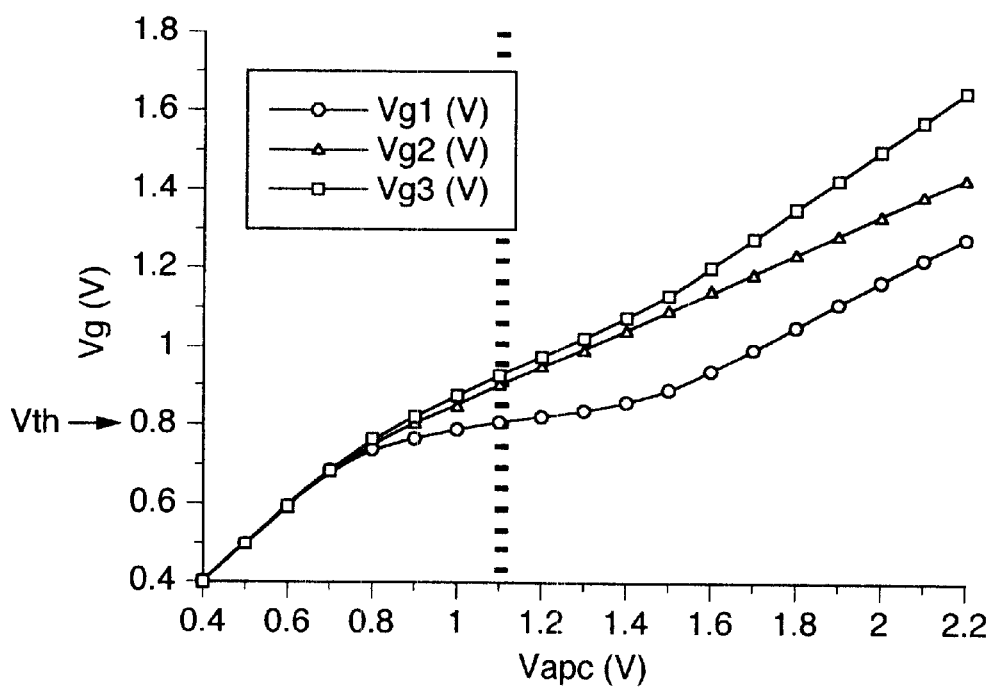
FIG. 12 is a graph showing the correlation of gate voltages to a control voltage associated with by a bias circuit in the high frequency power amplifier module according to the fifth embodiment.
Figure 11:
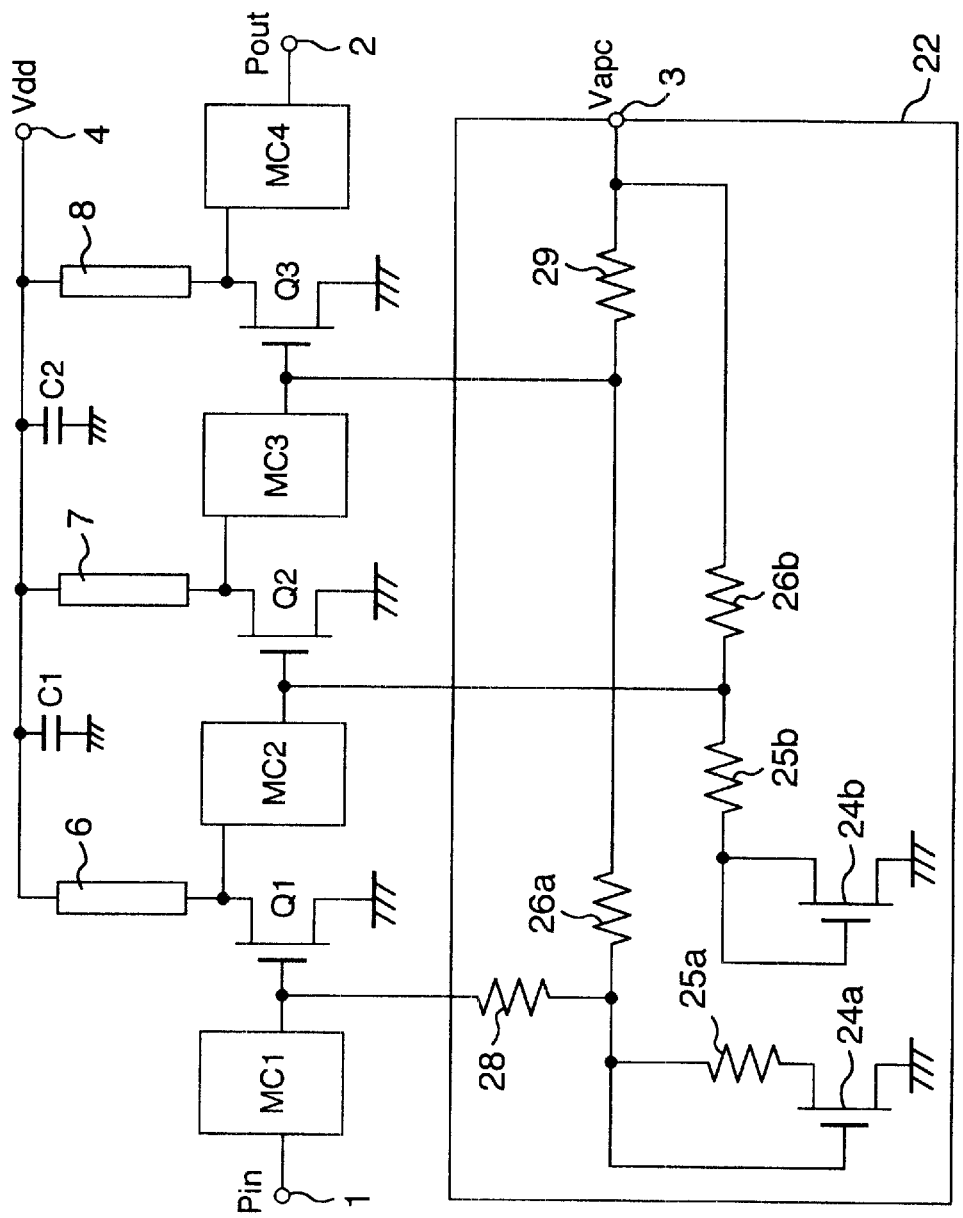
FIG. 11 is a circuit diagram illustrating a three-stage high frequency power amplifier module according to a further embodiment (fifth embodiment) of the present invention.

FIGS. 11 and 12 show a circuit diagram of a three-stage high frequency power amplifier module according to a further embodiment of the present invention, and the characteristics of the module. The fifth embodiment employs a two-step change nonlinear bias for a first-stage MOSFET Q1; a single-step change nonlinear bias for a middle-stage MOSFET Q2; and a two-step change nonlinear bias for a last-stage MOSFET Q3.

As illustrated in FIG. 11, the circuit configuration of the fifth embodiment is identical to the circuit configuration of the fourth embodiment except for the configuration of a gate bias circuit (GBC) 22.

In the fifth embodiment, a MOSFET 24a, a first resistor 25a, a second resistor 26a and a resistor 28 for cutting high frequency signal components are connected to a control terminal of the transistor Q1 as a bias circuit, such that the nonlinear characteristics change in two steps. The second resistor 26a has one terminal connected to a control terminal 3 through a resistor 29.

A MOSFET 24b, a first resistor 25b, and a second resistor 26b are connected to a control terminal of the transistor Q2 as a bias circuit, and a resistor for cutting high frequency signal components is omitted, such that the nonlinear characteristics change in one step.

The transistor Q3 has a control terminal connected to the joint of the second resistor 26a and the resistor 29 in the bias circuit associated with the transistor Q1, such that the nonlinear characteristics change in two steps.

The characteristics of the high frequency power amplifier module according to the fifth embodiment, i.e., the correlation of the gate voltage Vg to the control voltage Vapc is represented by a graph shown in FIG. 12.

The timings at which the respective MOSFETs turn on are set such that those of the last stage and the middle stage turn on earlier than that of the first stage. A bias for an output stage is designed to provide a two-step change, causing the output power to follow the increasing control voltage Vapc. At least in the first stage, the threshold voltage Vth of the MOSFET in the bias circuit is identical to or close to the threshold voltage Vth of the MOSFET for amplification in the stage associated therewith.

In the power module according to the fifth embodiment, since the last stage and the middle-stage MOSFETs Q2, Q3 turn on before the first-stage MOSFET Q1 turns on to apply the last stage and middle-stage MOSFETs Q2, Q3 with biases which provide gains, it is possible to mitigate an abrupt change in the output power in a low control voltage region before the first-stage MOSFET Q1 turns on.

Also, in a control voltage region in which the first-stage MOSFET Q1 turns on, the first-stage MOSFET Q1 is applied with a gate bias to reduce fluctuations near the threshold voltage Vth, and the middle-stage and last-stage MOSFETs Q2, Q3 are supplied with gate biases at that time to a region in which the gain fluctuates less, so that fluctuations in the output power can also be reduced in the region in which the first-stage MOSFET Q1 turns on.

Further, since the MOSFET in each of the stages can be supplied with a bias which provides desired characteristics at a high output, the improved controllability will never damage the characteristics of the power module.

Furthermore, since the two-step change nonlinear bias is implemented in the bias circuit for the last-stage MOSFET in a high control voltage region, where large output power is required, it is possible to prevent the output power from saturating due to an increase in the control voltage Vapc.

Since the MOSFETs used in the bias circuits can be formed by the same semiconductor process technologies as the MOSFETs for amplification, it is possible to reduce variations in the characteristics of the devices and to integrate them into a single chip, as is the case of the aforementioned embodiments.

(Sixth Embodiment)

Figure 13:
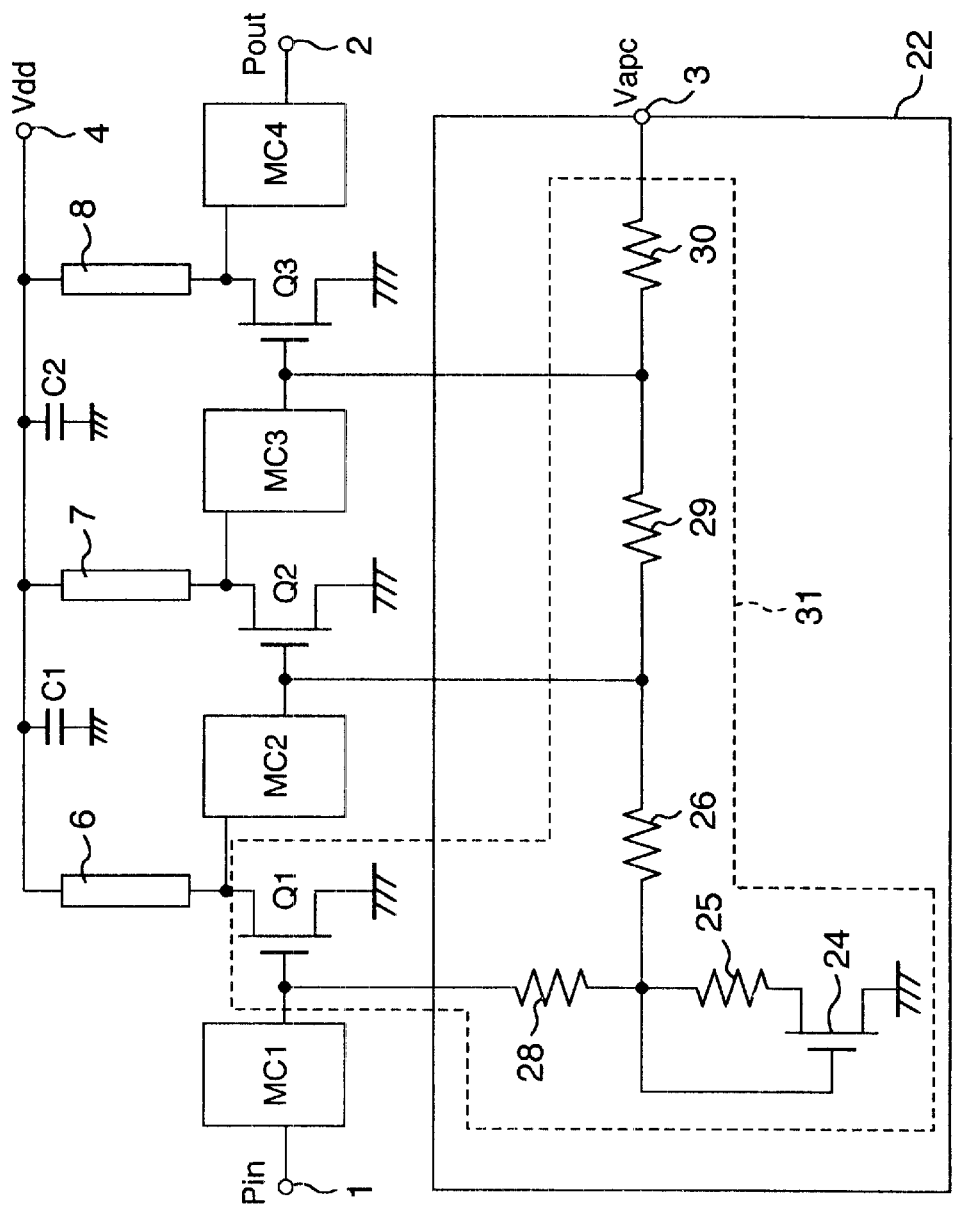
FIG. 13 is a circuit diagram illustrating a three-stage high frequency power amplifier module according to a further embodiment (sixth embodiment) of the present invention.
Figure 14:
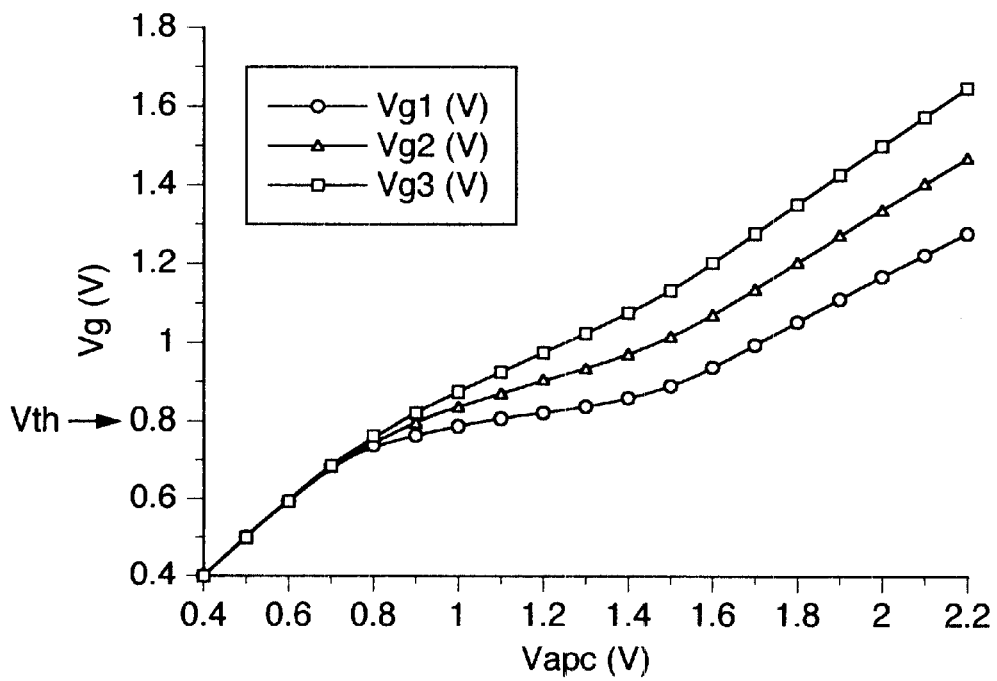
FIG. 14 is a graph showing the correlation of gate voltages to a control voltage associated with a bias circuit in the high frequency power amplifier module according to the sixth embodiment.

FIGS. 13 and 14 are diagrams related to a three-stage high frequency power amplifier module according to a further embodiment of the present invention. FIG. 13 is a circuit diagram of the module, and FIG. 14 graphically shows the correlation of gate voltages to a control voltage.

As illustrated in FIG. 13, the sixth embodiment employs a two-step change nonlinear bias for all MOSFETs (transistors Q1, Q2, Q3). A first-stage MOSFET Q1, a MOSFET 24 and resistors 25, 26, 28, 29, 30 are formed in a single chip 31. The timings at which the respective MOSFETs (Q1, Q2, Q3) turn on are set such that the last-stage and the middle-stage MOSFETs turn on earlier than the first-stage MOSFET. A bias for an output stage is designed to provide a two-step change, causing the output power to follow the increasing control voltage Vapc. The MOSFETs for use in bias circuits can be used commonly in the respective stages, and their threshold value Vth is set to be identical or close to the threshold value of associated MOSFETs for amplification in the respective stages.

As shown in the graph of FIG. 14, in the power module biased according to the sixth embodiment, the last-stage and the middle-stage MOSFETs Q2, Q3 turn on before the first-stage MOSFET Q1 turns on. In a control voltage region in which the first-stage MOSFET Q1 turns on, the first-stage MOSFET Q1 is supplied with a gate bias to reduce fluctuations near the threshold voltage Vth. Meanwhile, the middle-stage and last-stage MOSFETs Q2, Q3 are supplied with gate biases to a region in which the gain fluctuates less, so that fluctuations in the output power can also be reduced in this region.

Further, since the MOSFET in each of the stages can be supplied with a bias which provides desired characteristics at a high output, the improved controllability will never damage the characteristics of the power module.

Furthermore, since the two-step change nonlinear bias is implemented in the bias circuit for the last-stage MOSFET in a high control voltage region, where large output power is required, it is possible to prevent the output power from saturating due to an increase in the control voltage Vapc.

Since the MOSFETs used in the bias circuits can be formed by the same semiconductor process technologies as the MOSFETs for amplification, it is possible to reduce variations in the characteristics of the devices and to integrate them into a single chip.

(Seventh Embodiment)

Figure 15:
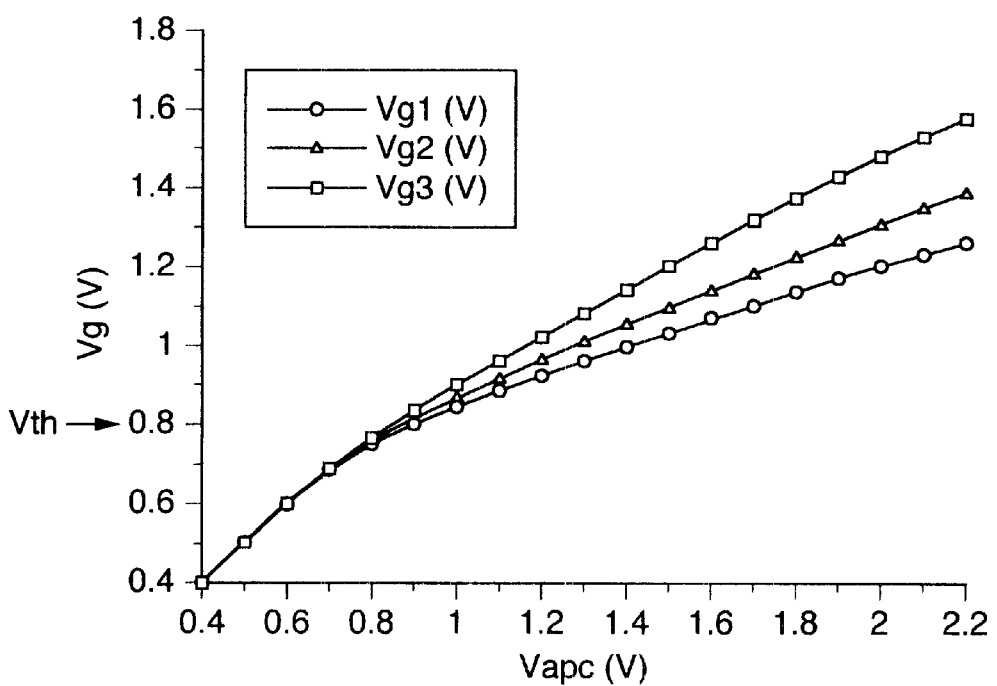
FIG. 15 is a graph showing the correlation of gate voltages to a control voltage associated with a bias circuit in a three-stage high frequency power amplifier module according to a further embodiment (seventh embodiment) of the present invention.
Figure 16:
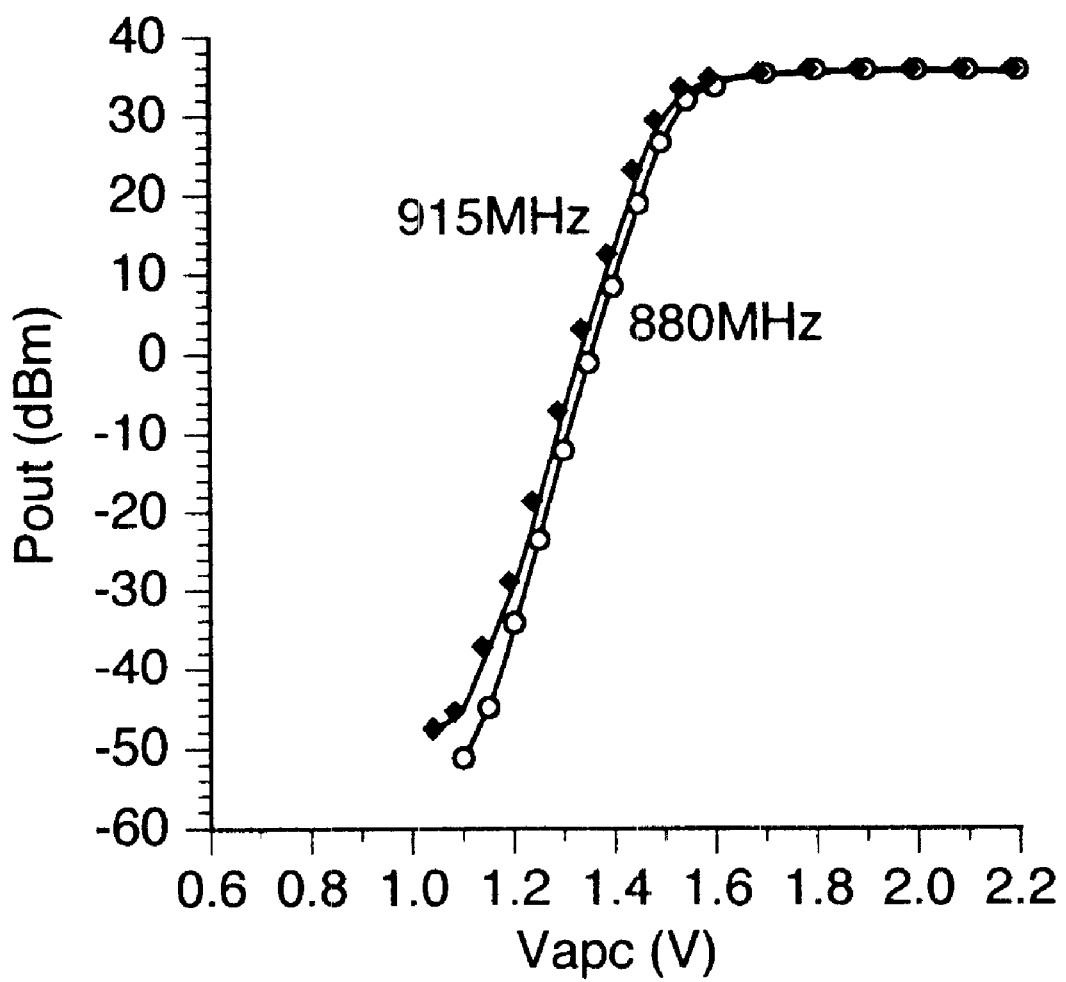
FIG. 16 is a graph showing the correlation of output power to a control voltage, derived from a test conducted by the present inventors.

FIG. 15 is a graph showing the correlation of gate voltages to a control voltage associated with a bias circuit for a three-stage high frequency power amplifier module according to a further embodiment of the present invention.

The bias circuit in the high frequency power amplifier module according to the seventh embodiment is similar the bias circuit of the second embodiment illustrated in FIG. 5 except that the resistor 25 is omitted. With this configuration, all transistors Q1, Q2, Q3 exhibit first-step change nonlinear characteristics, as shown in FIG. 15. Therefore, when the bias circuit is designed to turn on the last-stage and middle-stage transistors earlier than the first-stage transistor, the controllability for the output power Pout can be improved as is the case of the bias circuits in the respective embodiments described above.

In the foregoing embodiments, the last-stage amplifier may be provided with two-step incremental change gate bias characteristics to achieve a high power efficiency and a high controllability in both of a low power region and a high power region without the need for switching means.

While the present invention made by the inventors has been described specifically based on several embodiments, it goes without saying that the present invention is not limited to the aforementioned embodiments but may be modified in a variety of ways without departing from the spirit and scope of the invention. For example, while the foregoing embodiments have been described for the examples in which the present invention is applied to a high frequency power amplifier module implemented by MOSFETs formed of silicon or heterobipolar transistors (HBT) which utilize a junction of different materials such as GaAs and AlGaAs, the present invention can be similarly applied to other high frequency power amplifier modules which employ other transistors, and produce similar effects. For example, the present invention can be applied to a high frequency power amplifier module which employ MISFETs (Metal-Insulator Semiconductor-FET) formed of silicon in a different structure, MESFETs (Metal-Semiconductor-FET) formed of GaAs, HEMTs (High Electron Mobility Transistor) formed of compound semiconductor, transistors formed of Si and Ge, and so on, as well as a wireless communication apparatus which incorporates such high frequency power amplifier module.

Although the foregoing description has been mainly centered on the present invention made by the inventors which is applied to a mobile communication device (portable telephone), i.e., the field of utilization which is the background of the invention, the present invention is not limited to this field.

Rather, the present invention can be applied at least to a wireless communication apparatus.

What is claimed is:

1. A high frequency power amplifier module comprising:
   an input terminal;
   an output terminal;
   a control terminal;
   a first semiconductor amplifier device having a control terminal connected to said input terminal, and a first terminal for outputting an output signal in accordance with a signal supplied to said input terminal;
   a second semiconductor amplifier device having a control terminal, a first terminal, and a second terminal, said second semiconductor amplifier device positioned between the first terminal of said first semiconductor amplifier device and said output terminal for outputting a signal in accordance with said output signal; and
   a bias circuit connected to said control terminal for supplying the control terminal of said first semiconductor amplifier device with a bias which exhibits nonlinear characteristics in response to a control voltage supplied to said control terminal,
   wherein said first semiconductor amplifier device become operative after said second semiconductor amplifier device has been operated.

2. A high frequency power amplifier module according to claim 1, further comprising a bias circuit connected to said control terminal for supplying the control terminal of said second semiconductor amplifier device with a bias which exhibits nonlinear characteristics in response to the control voltage supplied to said control terminal.

3. A high frequency power amplifier module according to claim 2, wherein said bias supplied to the control terminal of said first semiconductor amplifier device exhibits nonlinear characteristics which change in two steps in response to a change in said control voltage, and the bias supplied to the control terminal of said second semiconductor amplifier device exhibits nonlinear characteristics which change in one step or in two steps in response to a change in said control voltage.

4. A high frequency power amplifier module comprising:
   an input terminal;
   an output terminal;
   a control terminal;
   a first semiconductor amplifier device having a control terminal for receiving a signal from said input terminal, and a first terminal for outputting a signal in accordance with the signal from said input terminal;
   a second semiconductor amplifier device having a control terminal for receiving a signal in accordance with the signal outputted from the first terminal of said first semiconductor amplifier device, and a first terminal connected to said output terminal for outputting a signal depending on said signal;

a bias circuit connected to said control terminal for supplying the control terminal of said first semiconductor amplifier device with a bias which exhibits a nonlinear characteristic in response to a control voltage supplied to said control terminal; and at least one third semiconductor amplifier device cascaded between said first semiconductor amplifier device and said second semiconductor amplifier device, said third semiconductor amplifier device having a control terminal connected to a first terminal of a semiconductor amplifier device in a preceding stage, and a first terminal connected to a control terminal of a semiconductor amplifier device in a subsequent stage, wherein:

said semiconductor amplifier devices constitute an amplifier circuit in a three-stage configuration formed of a first-stage semiconductor amplifier device, a middle-stage semiconductor amplifier device and a last-stage semiconductor amplifier device;

biases supplied by bias circuits connected to said first-stage semiconductor amplifier device and said last-stage semiconductor amplifier device exhibit nonlinear characteristics which change in two steps in response to a change in said control voltage; and a bias supplied by a bias circuit connected to said middle-stage semiconductor amplifier device exhibits nonlinear characteristics which change in one step in response to a change in said control voltage.

5. A wireless communication apparatus having a high frequency power amplifier module in a transmission side output stage, wherein said high frequency power amplifier module comprises:

an input terminal;

an output terminal;

a control terminal;

a first semiconductor amplifier device having a control terminal connected to said input terminal, and a first terminal for outputting an output signal in accordance with a signal supplied to said input terminal;

a second semiconductor amplifier device having a control terminal, a first terminal, and a second terminal, said second semiconductor amplifier device positioned between the first terminal of said first semiconductor amplifier device and said output terminal for outputting a signal in accordance with said output signal; and a bias circuit connected to said control terminal for supplying the control terminal of said first semiconductor amplifier device with a bias which exhibits nonlinear characteristics in response to a control voltage supplied to said control terminal, wherein said first semiconductor amplifier device become operative after said second semiconductor amplifier device has been operated.

6. A wireless communication apparatus according to claim 5, further comprising a bias circuit connected to said control terminal for supplying the control terminal of said second semiconductor amplifier device with a bias which exhibits nonlinear characteristics in response to the control voltage supplied to said control terminal.

7. A wireless communication apparatus according to claim 6, wherein said bias supplied to the control terminal of said first semiconductor amplifier device exhibits nonlinear characteristics which change in two steps in response to a change in said control voltage, and the bias supplied to the control terminal of said second semiconductor amplifier device exhibits nonlinear characteristics which change in one step or in two steps in response to a change in said control voltage.

8. A wireless communication apparatus subsequent stage, wherein:

said semiconductor amplifier devices constitute an amplifier circuit in a three-stage configuration formed of a first-stage semiconductor amplifier device, a middle-stage semiconductor amplifier device and a last-stage semiconductor amplifier device;

biases supplied by bias circuits connected to said first-stage semiconductor amplifier device and said last-stage semiconductor amplifier device exhibit nonlinear characteristics which change in two steps in response to a change in said control voltage; and a bias supplied by a bias circuit connected to said middle-stage semiconductor amplifier device exhibits nonlinear characteristics which changes in one step in response to a change in said control voltage.

* * * * *